(12) United States Patent
Fukuzumi

(10) Patent No.: US 7,084,469 B2
(45) Date of Patent: Aug. 1, 2006

(54) MAGNETIC STORAGE DEVICE COMPRISING MEMORY CELLS INCLUDING MAGNETO-RESISTIVE ELEMENTS

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/887,834

(22) Filed: Jul. 12, 2004

(65) Prior Publication Data

US 2005/0104102 A1      May 19, 2005

(30) Foreign Application Priority Data

Nov. 17, 2003  (JP) .............................. 2003-386835

(51) Int. Cl.
*H01L 29/82* (2006.01)
(52) U.S. Cl. ................ 257/421; 257/295; 438/3; 438/48
(58) Field of Classification Search ................ 257/295, 257/421; 438/3, 48, 240
See application file for complete search history.

(56) References Cited

U.S. PATENT DOCUMENTS

| | | | |
|---|---|---|---|
| 6,407,011 B1 * | 6/2002 | Ikeda et al. ................ | 438/786 |
| 6,649,953 B1 * | 11/2003 | Cha ............................ | 257/295 |
| 6,815,784 B1 * | 11/2004 | Park et al. ................... | 257/421 |
| 6,906,374 B1 * | 6/2005 | Tanaka ........................ | 257/306 |
| 2003/0227043 A1 * | 12/2003 | Kutsunai .................... | 257/299 |
| 2004/0135189 A1 * | 7/2004 | Kiyotoshi .................... | 257/306 |

FOREIGN PATENT DOCUMENTS

JP        2002-368197        12/2002

OTHER PUBLICATIONS

Roy Scheuerlein, et al., "A 10ns Read and Write Non-Volatile Memory Array Using a Magnetic Tunnel Junction and FET Switch in Each Cell", ISSCC2000 Technical Digest, 2000, pp. 128-129.

* cited by examiner

*Primary Examiner*—Andy Huynh
(74) *Attorney, Agent, or Firm*—Oblon, Spivak, McClelland, Maier & Neustadt, P.C.

(57) ABSTRACT

A magnetic storage device comprises an interlayer insulation film, a metal oxide film, a conductive film, and a magneto-resistive element. The interlayer insulation film is formed on a semiconductor substrate. The metal oxide film is formed on the interlayer insulation film. The conductive film is formed on the metal oxide film and contains metal elements. The magneto-resistive element is formed on the conductive film.

19 Claims, 7 Drawing Sheets

To first MRAM data rewrite control section

F I G. 10

F I G. 11

MAGNETIC STORAGE DEVICE COMPRISING MEMORY CELLS INCLUDING MAGNETO-RESISTIVE ELEMENTS

CROSS-REFERENCE TO RELATED APPLICATIONS

This application is based upon and claims the benefit of priority from prior Japanese Patent Application No. 2003-386835, filed Nov. 17, 2003, the entire contents of which are incorporated herein by reference.

BACKGROUND OF THE INVENTION

1. Field of the Invention

This invention relates to a magnetic storage device and, more particularly, a magnetic storage device comprising memory cells including magneto-resistive elements.

2. Description of the Related Art

Recently, a magnetic storage device (magnetic random access memory: MRAM) including magneto-resistive elements using the TMR (Tunneling Magneto-Resistive) effect has been noticed (see, for example, ISSCC2000 Technical Digest p.128, "A 10 ns Read and Write Non-Volatile Memory Array Using a Magnetic Tunnel Junction and FET Switch in each Cell").

The MRAM comprises a plurality of alloys and needs to be formed basically in a low temperature process. The high-speed processing and nonvolatility of the MRAM are expected to show the maximum performance by use with a high-speed logic LSI.

In the high-speed logic LSI, a low dielectric constant film (hereinafter Low-k film) remarkably tends to be used as an interlayer insulation film. The Low-k film is higher in moisture absorbency than a pure silicon oxide ($SiO_2$) film, since it has a porous structure including metal impurities or similar reasons. It is therefore difficult to assure enough adhesion on an interface between the Low-k film serving as the interlayer insulation film and a metal thin film used for the MRAM.

Moreover, in a case of the MRAM, if writing on a free layer is repeated, stress resulting from magnetostriction may easily induce exfoliation in the interface and cause problems on reliability.

BRIEF SUMMARY OF THE INVENTION

A magnetic storage device according to an aspect of the present invention comprises an interlayer insulation film, a metal oxide film, a conductive film, and a magneto-resistive element. The interlayer insulation film is formed on a semiconductor substrate. The metal oxide film is formed on the interlayer insulation film. The conductive film is formed on the metal oxide film and contains metal elements. The magneto-resistive element is formed on the conductive film.

DETAILED DESCRIPTION OF THE INVENTION

A semiconductor device comprising a magnetic storage device according to embodiments of the present invention will be described below with reference to drawings. In the drawings, like elements are denoted throughout by like or similar reference numbers.

FIRST EMBODIMENT

First, a magnetic storage device according to a first embodiment of the present invention will be described.

Figure 1:
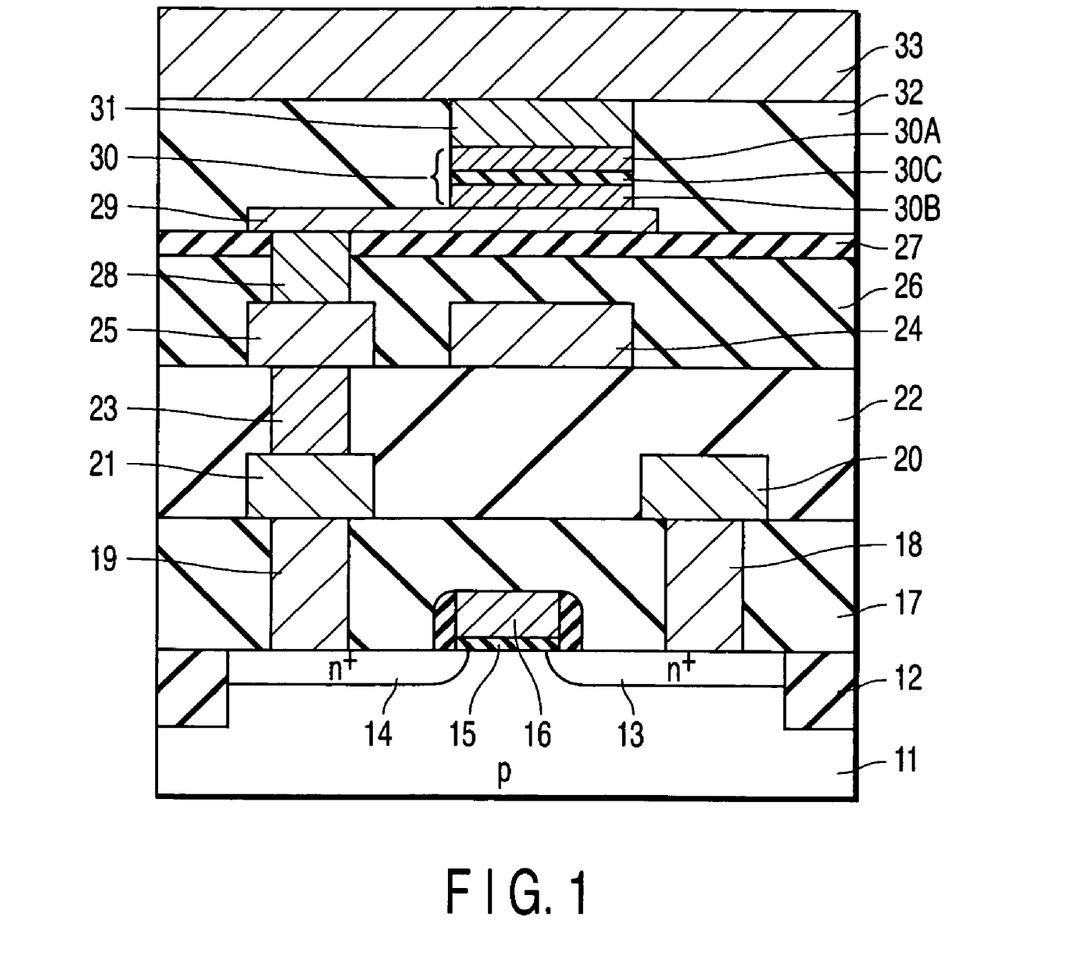
FIG. 1 is a cross-sectional view showing a structure of a magnetic storage device according to a first embodiment of the present invention.

FIG. 1 is a cross-sectional view showing a structure of a magnetic storage device according to a first embodiment of the present invention.

A STI (Shallow Trench Isolation) region 12 serving as an element separation region is formed on a surface region of a p-type silicon semiconductor substrate 11 and element areas sectioned by the STI region 12 are also formed. On a surface region of the p-type semiconductor substrate 11, $n^+$-type impurity diffusion regions serving as a source region 13 and a drain region 14 of-a MOS field effect transistor (cell transistor) are formed.

A gate insulation film 15 is formed on the p-type semiconductor region 11 between the source region 13 and the drain region 14. A gate electrode 16 working as a read word line is formed on the gate insulation film 15.

A first interlayer insulation film 17 is formed on the p-type semiconductor substrate 11 and the gate electrode 16. Contact plugs 18, 19 are formed in the first interlayer insulation film 17 on the source region 13 and the drain region 14, respectively. A source line 20 and an interconnection 21 composed of an interconnection layer in a first layer are formed on the first interlayer insulation film 17. The source line 20 is electrically connected to the source region 13 via the contact plug 18. The interconnection 21 is connected to the drain region 14 via the contact plug 19.

A second interlayer insulation film 22 is formed on the first interlayer insulation film 17, the source line 20 and the interconnection 21. A contact plug 23 is formed in the second interlayer insulation film 22 on the interconnection 21. A write word line 24 and an interconnection 25 composed of an interconnection layer in a second layer formed on the first layer are formed on the second interlayer insulation film 22. The write word line 24 is formed to extend along the same direction as the read word line (gate electrode) 16. The interconnection 25 is formed on the contact plug 23 and is electrically connected to the interconnection 21 via the contact plug 23.

A third interlayer insulation film (Low-k film) 26 having a small dielectric constant is formed on the second interlayer insulation film 22, the write word line 24 and the interconnection 25. The Low-k film 26 is formed of a $SiO_2$-based film containing silicon oxide ($SiO_2$) as its main component and has a smaller dielectric constant than a pure silicon oxide film ($SiO_2$). The dielectric constant of the Low-k film 26 is set at 3 or smaller here.

A metal oxide film 27, for example, a tantalum oxide film ($Ta_2OS_5$) is formed on the third interlayer insulation film (Low-k film) 26. The thickness of the metal oxide film 27 is, for example, 1 nm or more. A contact plug 28 is formed in the Low-k film 26 and the metal oxide film 27, above the interconnection 25. A conductive film formed of a metal or, for example, an interconnection 29 formed of tantalum (Ta) is formed on the metal oxide film 27. The interconnection 29 is electrically connected to the interconnection 25 via the contact plug 28.

A magneto-resistive element 30 having a MTJ (Magnetic Tunnel Junction) multilayer structure is formed at a position on the interconnection 29, above the write word line 24. In a structure of the magneto-resistive element 30, an insulation layer (tunnel barrier) 30C is sandwiched between two ferromagnetic layers (a memory layer and a pin layer) 30A, 30B. The insulation layer is formed of, for example, aluminum oxide ($Al_2O_3$). Furthermore, an antiferromagnetic layer (not shown) serving as a fixed layer is arranged on either side of the two ferromagnetic layers 30A, 30B. The direction of the spin on the magneto-resistive element 30 having the MTJ multilayer structure may be vertical or parallel about the cross-section of the figure.

A cap film 31 composed of a conductive body is formed on the ferromagnetic layer 30A. In a structure of the cap film 31, layers of Ta/Al/Ta are stacked in order from the ferromagnetic layer 30A side. A fourth interlayer insulation film 32 is formed on the metal oxide film 27 and the interconnection 29. A bit line 33 is arranged on the fourth interlayer insulation film 32 and the cap film 31 in a direction intersecting the direction of the write word line 24 and the read word line 16. The bit line works as a data read line or a data write line at a read or write time.

In the magnetic storage device having the above-described structure, the third interlayer insulation film 26 is formed of the $SiO_2$-based Low-k film containing $SiO_2$ as its main component. The metal oxide film (for example, the tantalum oxide film) 27 is formed on the Low-k film 26. The interconnection 29 on the metal oxide film 27 is formed of a metal film (for example, tantalum).

As the Low-k film 26 and the metal oxide film 27 are formed of oxides containing oxygen, adhesion between the contact surfaces of the Low-k film 26 and the metal oxide film 27 can be improved. Furthermore, as the metal oxide film 27 and the interconnection 29 contain metal elements and, particularly, the same metal element, i.e., tantalum in this embodiment. Therefore, adhesion between the metal oxide film 27 and the interconnection 29 can be improved.

For these reasons, a magneto-resistive element capable of certainly switching a resistance value with stable switching characteristics can be formed even for much use during a long time. As a result, a magnetic storage device of high reliability can be implemented. In other words, as adhesion of the contact surfaces can be improved, stress of good reproductivity can be applied to the magneto-resistive element and the magnetostriction can be exactly controlled. Thus, yield of the magnetic storage device comprising the magneto-resistive element can be improved. The structure which is stable against the repeated stress caused by the magnetostriction can be formed. The reliability of the magnetic storage device comprising the magneto-resistive element can be increased.

In the first embodiment, the metal oxide film 27 and the interconnection 29 on the metal oxide film 27 may contain the metal elements. For example, the metal oxide film 27 may be formed of aluminum oxide and the interconnection 29 may be formed of tantalum. It is preferable that the metal oxide film 27 and the interconnection 29 should contain the same metal element. For example, desirably, the metal oxide film 27 may be formed of titanium oxide and the interconnection 29 may be formed of titanium (Ti). Thus, if the metal oxide film 27 and the interconnection 29 are a combination containing the metal elements or the same element, adhesion between the films can be improved.

In addition, if the Low-k film 26 and the metal oxide film 27 on the Low-k film 26 contain the same elements, similar advantages can be obtained. For example, the Low-k film 26 and the metal oxide film 27 may contain nitrogen, carbon or the like, other than oxygen as described above.

Furthermore, a barrier metal may be formed on the interconnection shown in FIG. 1 and contact plugs to prevent diffusion of their constituent elements as occasion requires.

Figure 2A:
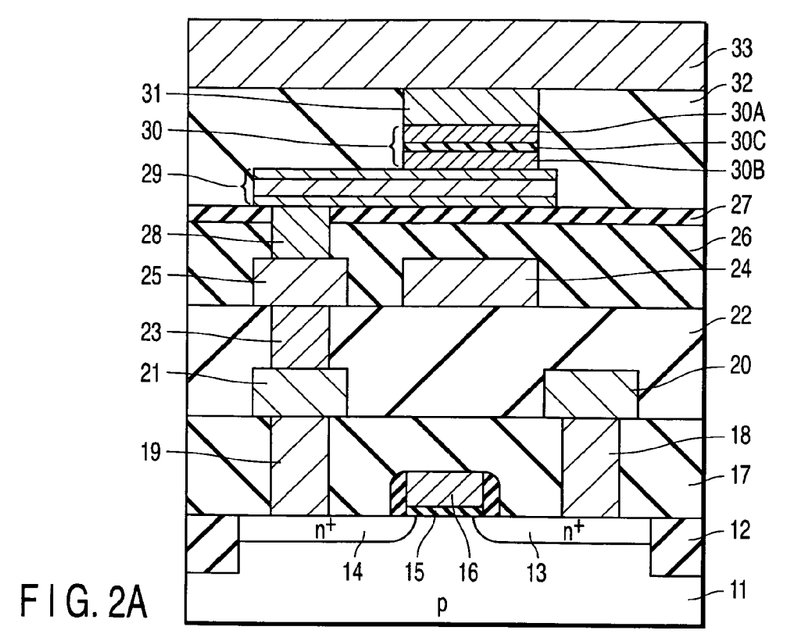
FIG. 2A is a cross-sectional view showing a structure of a modified example of the magnetic storage device according to the first embodiment.

FIG. 2A is a cross-sectional view showing a structure of a modified example of the magnetic storage device according to the first embodiment.

In the modified example, the interconnection 29 in the first embodiment shown in FIG. 1 has a multilayer structure. The interconnection 29 has a structure in which layers of Ta/Al/Ta are stacked in order. The other structure and advantages are the same as those of the first embodiment.

Figure 2B:
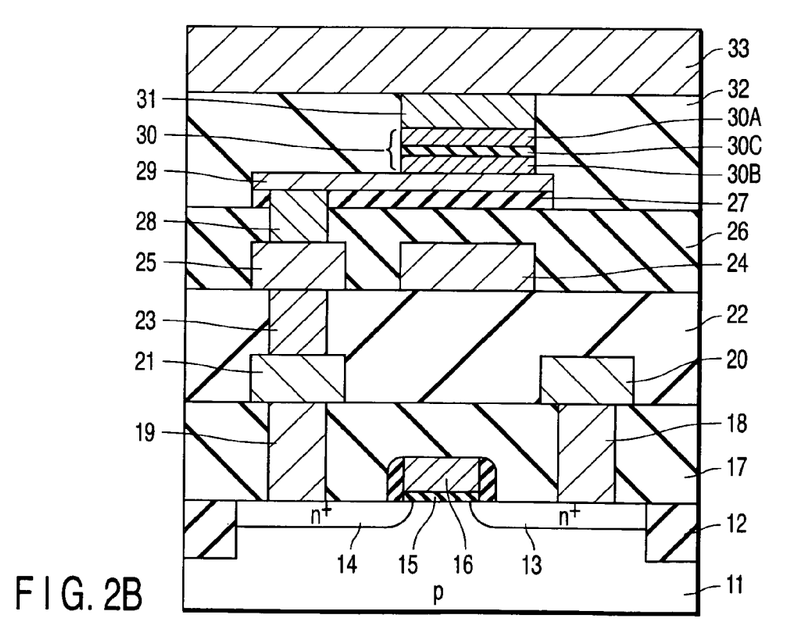
FIG. 2B is a cross-sectional view showing a structure of another modified example of the magnetic storage device according to the first embodiment.

FIG. 2B is a cross-sectional view showing a magnetic storage device according to a modified example of the first embodiment. In the modified example, the metal oxide film 27 is processed to have the same planar shape as the lead layer 29. Though not shown, if the contact plug is formed directly from the wiring layer in which the bit line 33 is formed to the wiring layer in which the write word line 24 is formed, in the peripheral circuit portion provided outside the memory cell, the metal oxide film 27 may make etching of the contact plug embedded hole difficult. Thus, yield of the contact plug formed in the peripheral circuit portion can be improved by removing the metal oxide film 27 at the portion which does not overlap the lead layer 29 as described in the modified example.

SECOND EMBODIMENT

Next, a magnetic storage device according to a second embodiment of the present invention will be described.

Figure 3:
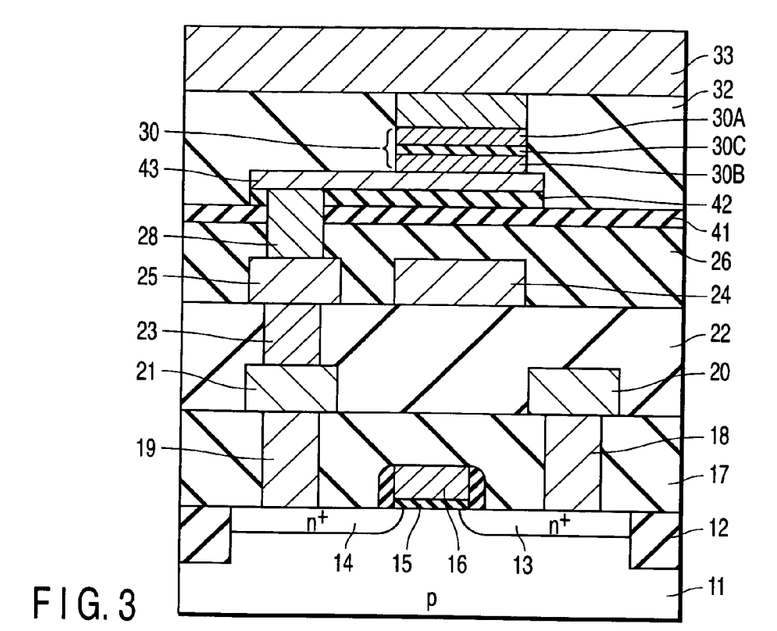
FIG. 3 is a cross-sectional view showing a structure of a magnetic storage device according to a second embodiment of the present invention.

FIG. 3 is a cross-sectional view showing a structure of the magnetic storage device according to the second embodiment.

In the magnetic storage device according to the second embodiment, a silicon nitride film 41, a metal nitride film 42 and an interconnection 43 are formed instead of the metal oxide film 27 formed on the third interlayer insulation film (Low-k film) 26 and the interconnection 29 in the first embodiment shown in FIG. 1. Like elements in the structure of the first embodiment are denoted by like or similar reference numbers and their explanations are omitted. Only different constituent elements will be explained below.

The third interlayer insulation film (Low-k film) 26 having a small dielectric constant is formed on the second interlayer insulation film 22, the write word line 24 and the interconnection 25. The Low-k film 26 is formed of a $SiO_2$-based film containing silicon oxide ($SiO_2$) as its main component, and has a smaller dielectric constant than that of a pure silicon oxide film ($SiO_2$). The dielectric constant of the Low-k film 26 is set at 3 or smaller here.

The silicon nitride film 41 is formed on the Low-k film 26. The silicon nitride film 41 has a function of preventing the magneto-resistive element 30 from being deteriorated by moisture included in the Low-k film 26. The silicon nitride film 41 may be a film containing silicon and nitrogen, for example, a SiON film, a SiCN film or the like. The metal nitride film 42, for example, aluminum nitride, tantalum nitride or titanium nitride is formed on the silicon nitride film 41. The thickness of the metal nitride film 42 is, for example, 1 nm or more.

The contact plug 28 is formed in the Low-k film 26, the silicon nitride film 41, and the metal nitride film 42, above the interconnection 25. A conductive film formed of metals, for example, the interconnection 43 formed of aluminum (Al), tantalum (Ta) or titanium (Ti) is formed on the metal nitride film 42. The interconnection 43 is electrically connected to the interconnection 25 via the contact plug 28.

If aluminum nitride is used for the metal nitride film 42, it is preferable to use aluminum for the interconnection 43 formed on the metal nitride film 42. If tantalum nitride is used for the metal nitride film 42, it is preferable to use tantalum for the interconnection 43 formed on the metal nitride film 42. If titanium nitride is used for the metal nitride film 42, it is preferable to use titanium for the interconnection 43 formed on the metal nitride film 42.

Moreover, the magneto-resistive element 30 having the MTJ (Magnetic Tunnel Junction) multilayer structure is formed at a position on the interconnection 43, above the write word line 24. The other constituent elements are the same as the first embodiment.

In the magnetic storage device having the above-described structure, the third interlayer insulation film 26 is formed of a $SiO_2$-based Low-k film containing silicon oxide ($SiO_2$) as its main component. The silicon nitride film 41, the metal nitride film (for example, aluminum nitride, tantalum nitride, titanium nitride) 42, and the metal film (for example, aluminum, tantalum, titanium) are formed in order, on the Low-k film 26.

As the silicon nitride film 41 and the metal nitride film 42 are nitrides containing nitrogen, adhesion between the contact surfaces of the silicon nitride film 41 and the metal nitride film 42 can be improved. Moreover, the metal nitride film 42 and the interconnection 43 contain the metal elements, and adhesion between the contact surfaces of the metal nitride film 42 and the interconnection 43 can be improved. Particularly, as aluminum nitride and aluminum, tantalum nitride and tantalum, or titanium nitride and titanium are used for the metal nitride film 42 and the interconnection 43, respectively, the films contain the same metal element. Therefore, adhesion between the contact surfaces of the metal nitride film 42 and the interconnection 43 can be further improved.

For these reasons, a magneto-resistive element capable of certainly switching a resistance value with stable switching characteristics can be formed even for much use during a long time. As a result, a magnetic storage device of high reliability can be implemented. In other words, as adhesion of the contact surfaces can be improved, stress of good reproductivity can be applied to the magneto-resistive element and the magnetostriction can be exactly controlled. Thus, yield of the magnetic storage device comprising the magneto-resistive element can be improved. The structure which is stable against the repeated stress caused by the magnetostriction can be formed. The reliability of the magnetic storage device comprising the magneto-resistive element can be increased.

In the second embodiment, the metal nitride film 42 and the interconnection 43 may contain the metal elements. For example, the metal nitride film 42 may be formed of aluminum nitride and the interconnection 43 may be formed of tantalum. It is preferable that the metal nitride film 42 and the interconnection 43 should contain the same metal element as described above. Thus, if the metal nitride film 42 and the interconnection 43 are a combination containing the metal elements or the same element, adhesion between the films can be improved.

In addition, if the Low-k film 26 and the silicon nitride film 41 on the Low-k film 26 contain the same elements, similar advantages can be obtained. For example, the Low-k film 26 and the silicon nitride film 41 may contain nitrogen, carbon or the like, other than oxygen as described above.

Furthermore, a barrier metal may be formed on the interconnection shown in FIG. 3 and contact plugs to prevent diffusion of their constituent elements as occasion requires.

Figure 4:
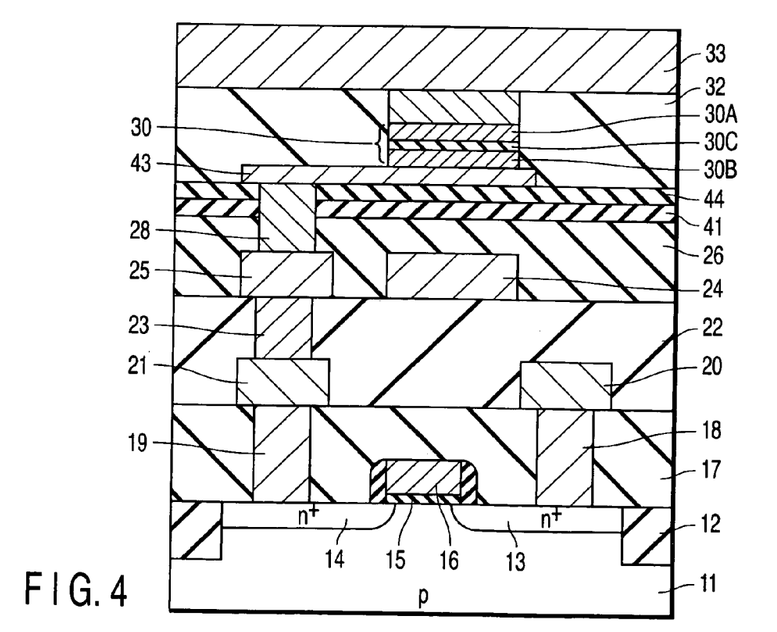
FIG. 4 is a cross-sectional view showing a structure of a modified example of the magnetic storage device according to the second embodiment.

FIG. 4 is a cross-sectional view showing a structure of a modified example of the magnetic storage device according to the second embodiment.

In this modified example, a metal nitride film 44 is formed by not cutting the metal nitride film 42 of the second embodiment shown in FIG. 3 in the same cross-section as the interconnection 43, but extending the metal nitride film 42 from the interconnection 43. Other constituent elements and advantages are the same as the second embodiment.

In the second embodiment, the silicon nitride film 41 and the metal nitride film 42 commonly contain nitrogen. For example, if the silicon nitride film is replaced with a silicon carbide film (SiC or SiCN) and the metal nitride film is replaced with a metal carbide film (for example, TiC), the same advantage can be obtained from the films since the films commonly contain carbon.

THIRD EMBODIMENT

The magnetic storage device (magnetic random access memory) according to the embodiments and their modified examples of the first and second embodiments of the present invention can be applied variously.

Some of the application examples will be described as a third embodiment of the present invention, with reference to FIGS. 5 to 11.

First, a digital subscriber line (DSL) modem in which a MRAM is applied to a DSL data path section will be explained as Application Example 1.

Figure 5:
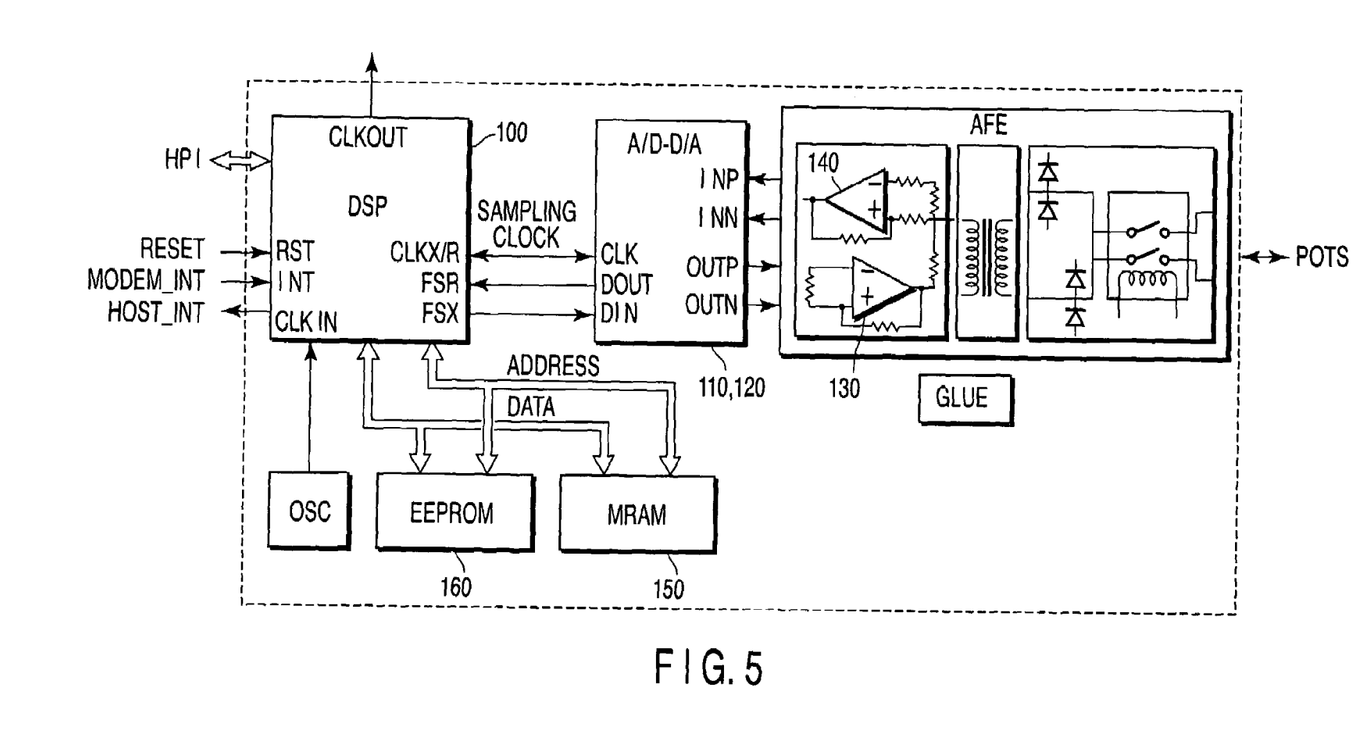
FIG. 5 is a block diagram showing a DSL data path section of a modem for digital subscriber lines to which the magnetic storage devices of the first and second embodiments are applied, according to a third embodiment of the present invention.

FIG. 5 is a diagram showing the DSL data path section of the DSL modem.

This modem comprises a programmable digital signal processor (DSP) 51, an analog-digital (A/D) converter 110, a digital-analog (D/A) converter 120, a band-pass filter (not shown), a transmission driver 130, a receiver amplifier 140 and the like. In the modem shown in FIG. 5, the band-pass filter is omitted. Instead, the modem comprises a MRAM 150 of the preceding embodiments and an EEPROM (electrically erasable and programmable read only memory) 160, as various types of optional memories storing line code programs (programs executed by the DSP to select and operate the modem in accordance with encoded subscriber line information, transmission conditions and the like (line codes; QAM, CAP, RSK, FM, AM, PAM, DWMT and the like)).

In Application Example 1, two kinds of memories, the MRAM 150 and the EEPROM 160, are used as the memories storing the line code programs. However, the EEPROM may be replaced with the MRAM. In other words, only MRAMs may be used instead of two kinds of memories.

Next, an example of applying the MRAM to a section of a mobile telephone terminal implementing a communication function will be explained as Application Example 2.

Figure 6:
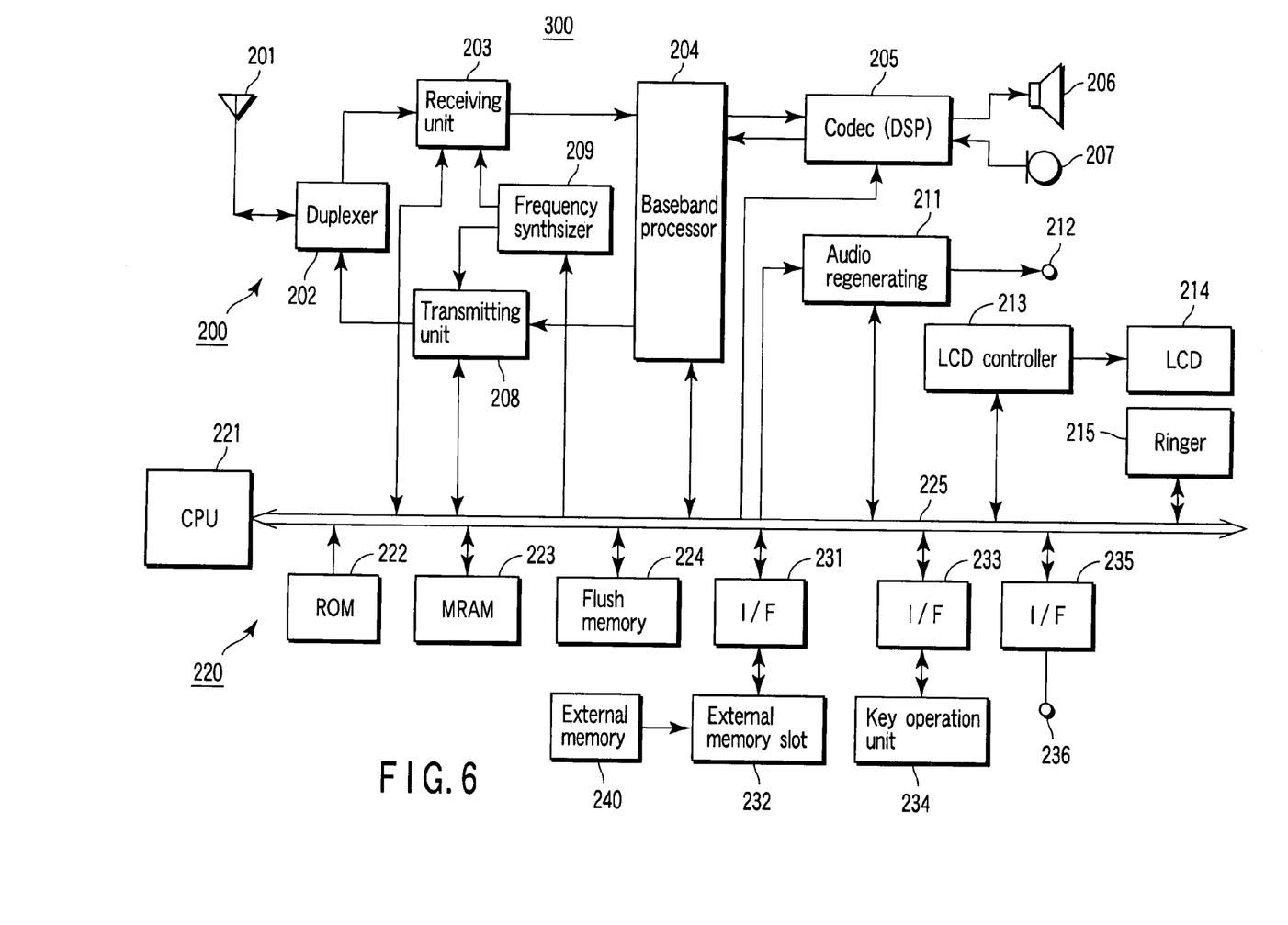
FIG. 6 is a block diagram showing a structure of a mobile telephone terminal to which the magnetic storage devices of the first and second embodiments are applied, according to the third embodiment.

FIG. 6 is a block diagram showing a structure of the mobile telephone terminal. A mobile telephone terminal 300 comprises a communication section 200 having a communication function and a control section 220 controlling the sections of the mobile telephone terminal.

The communication section 200 comprises a sending/receiving antenna 201, an antenna duplexer 202, a receiving unit 203, a baseband processor 204, a DSP 205 serving as a speech codec, a loudspeaker (receiver) 206, a microphone (sender) 207, a sending unit 208, a frequency synthesizer 209, and the like.

The control section 220 is a microcomputer in which a CPU 221, a ROM 222, a MRAM 223 of the preceding embodiments, and a flush memory 224 are connected by a CPU bus 225.

Programs executed by the CPU 221 and necessary data for display fonts and the like are prestored in the ROM 222. The MRAM 223 is used mainly as a work region. The MRAM 223 stores the data which are being calculated as occasion requires while the CPU 221 is executing the programs or temporarily stores the data exchanged between the control section 220 and each of units. The flush memory 224 stores, for example, conditions and the like that are set immediately before the power of the mobile telephone terminal 300 is turned off. In a case where the same conditions are set next time the power is turned on, the flush memory 224 stores the setting parameters. Thus, even when the power of the mobile telephone terminal 300 is turned off, the setting parameters stored in the flush memory 224 cannot be erased.

Moreover, the mobile telephone terminal 300 also comprises an audio regenerating unit 211, an external output terminal 212, an LCD controller 213, a LCD (liquid crystal display) for displaying 214, a ringer 215 generating a ringing tone, and the like. The audio regenerating unit 211 regenerates audio information which is input to the mobile telephone terminal 300 (or audio information which is stored in an external memory 240 to be explained later). The regenerated audio information is transmitted to a headphone, a potable loudspeaker or the like via the external output terminal 212, and can be thereby taken out to outside. Thus, the audio information can be regenerated by providing the audio regenerating unit 211. The LCD controller 213, for example, receives display information from the CPU 221 via the CPU bus 225, converts the display information into LCD control information to control the LCD 214, and drives the LCD 214 to execute the displaying.

The mobile telephone terminal 300 comprises interface circuits (I/F) 231, 233, 235, an external memory 240, an external memory slot 232, a key operation unit 234, an external input/output terminal 236 and the like. The external memory 240 such as a memory card or the like is inserted into the external memory slot 232. The external memory slot 232 is connected to the CPU bus 225 via the interface circuit (I/F) 231. Thus, by providing the external memory slot 232 on the mobile telephone terminal 300, the information in the mobile telephone terminal 300 can be written in the external memory 240 or the information (for example, audio information) stored in the external memory 240 can be input to the mobile telephone terminal 300. The key operation unit 234 is connected to the CPU bus 225 via the interface circuit (I/F) 233. The key input information that is input from the key operation unit 234 is transmitted to, for example, the CPU 221. The external input/output terminal 236 is connected to the CPU bus 225 via the interface circuit (I/F) 235 to serve as a terminal for inputting various kinds of information from the outside to the mobile telephone terminal 300 or outputting the information from the mobile telephone terminal 300 to the outside.

In Application Example 2, the ROM 222, the MRAM 223 and the flush memory 224 are used. However, the flush memory 224 may be replaced with a MRAM and the ROM 222 may also be replaced with a MRAM.

Next, an example of applying the MRAM to a card (MRAM card) such as a smart media storing media contents will be explained as Application Example 3.

FIGS. 7 to 11 are illustrations showing an example of applying the MRAM to the MRAM card.

Figures 7, 8:
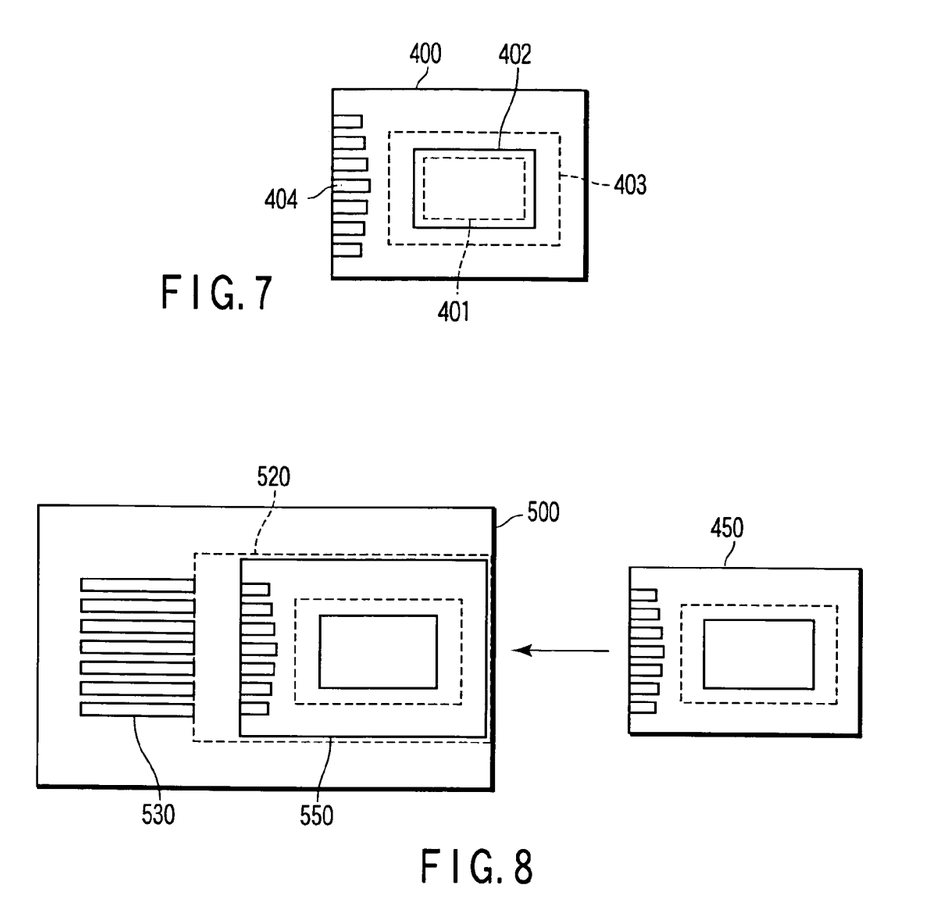
FIG. 7 is an illustration showing a structure of a MRAM card to which the magnetic storage devices of the first and second embodiments are applied, according to the third embodiment.
FIG. 8 is a top view of a card insertion type transfer device, transferring data to the MRAM card.

A MRAM chip 401 is built in a MRAM card body 400 as shown in FIG. 7. An opening portion 402 is formed at a position corresponding to the MRAM chip 401, on the MRAM card body 400 such that the MRAM chip 401 is exposed. A shutter 403 is provided at the opening portion 402. When the MRAM card is carried, the MRAM chip 401 is protected by the shutter 403.

The shutter 403 is formed of a material which is effective for shielding of an external magnetic field. When the data is transferred, the shutter 403 is opened to expose the MRAM chip 401. An external terminal 404 is provided to take out the contents data stored in the MRAM card to the outside.

Figure 9:
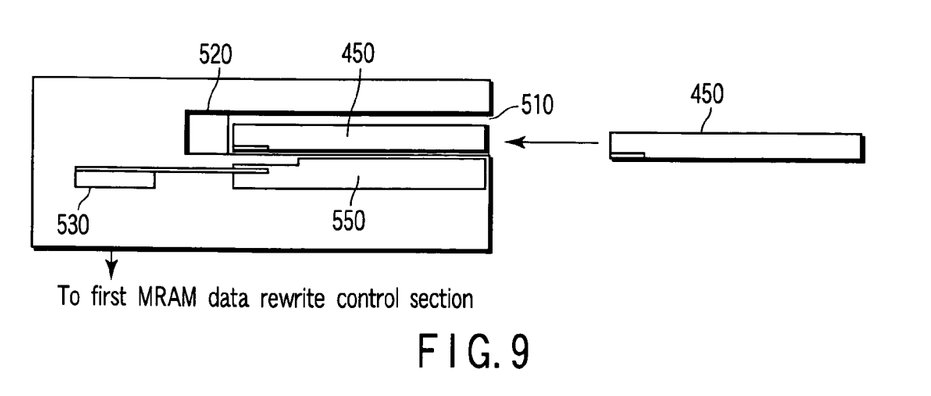
FIG. 9 is a cross-sectional view of the card insertion type transfer device.

FIGS. 8 and 9 show a transfer device transferring the data to the MRAM card. FIG. 8 is a top view of a card insertion type transfer device and FIG. 9 is a cross-sectional view thereof.

A second MRAM card 450 which an end user uses is inserted into a transfer device 500 from an insertion portion 510 thereof as represented by an arrow and pushed until the card stops at a stopper 520. The stopper 520 also serves as a member positioning a first MRAM 550 and the second MRAM card 450. When the second MRAM card 450 is arranged at a predetermined position, a control signal is supplied from a first MRAM data rewrite control section to an external terminal 530 and the data stored in the first MRAM 550 is transferred to the second MRAM card 450.

Figure 10:
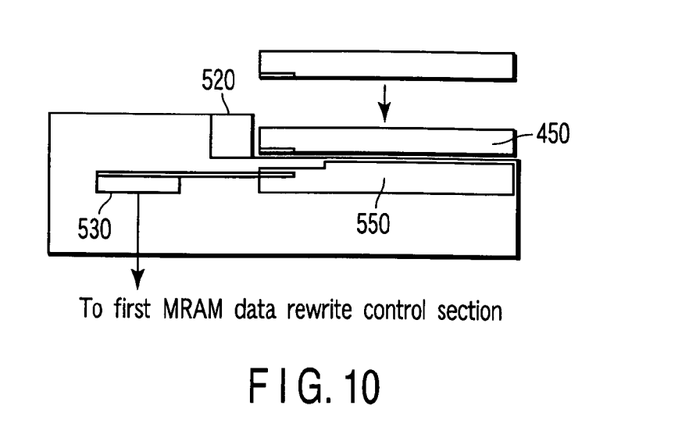
FIG. 10 is a cross-sectional view of a snap-on type transfer device, transferring data to the MRAM card.

FIG. 10 is a cross-sectional view of a snap-on type transfer device. In the transfer device, the second MRAM card 450 is snapped and placed on the first MRAM 550 in view of the stopper 520, as represented by an arrow. The transferring method is the same as the card insertion type transfer device and its explanation is therefore omitted here.

Figure 11:
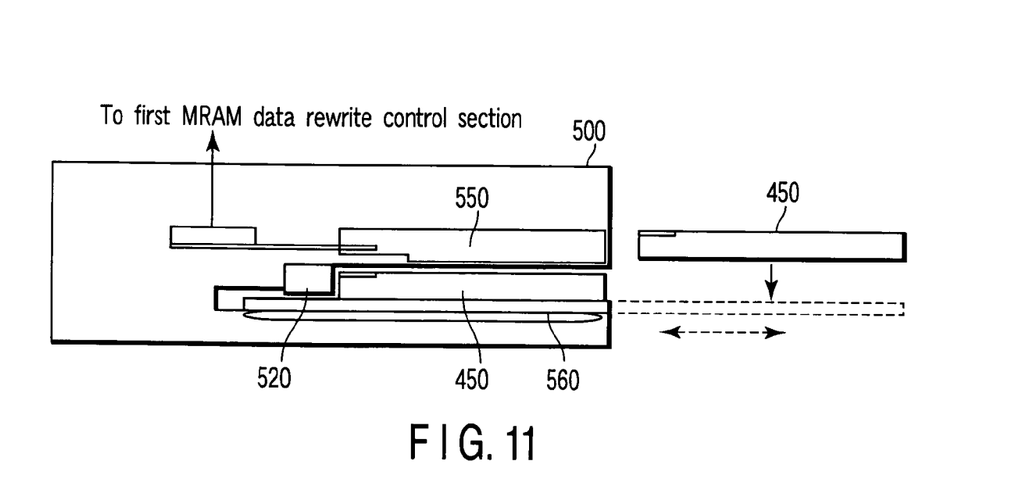
FIG. 11 is a cross-sectional view of a slide-in type transfer device, transferring data to the MRAM card.

FIG. 11 is a cross-sectional view of a slide-in type transfer device. The transfer device 500 comprises a tray slide 560 similarly to a CD-ROM drive or a DVD drive. The tray slide 560 moves as represented by arrows. When the tray slide 560 moves to a position represented by a broken line, the second MRAM card 450 is placed on the tray slide 560 and conveyed into the transfer device 500. The feature of conveying the second MRAM card 450 such that a top end of the second MRAM card 450 abuts on the stopper 520 and the transferring method are the same as the card insertion type transfer device. Therefore explanations of the conveyance and the transferring method are omitted here.

The first and second embodiments have been described on the basis of the example of applying the present invention to the MRAM. However, a semiconductor integrated circuit device in which the MRAM is built, for example, a processor, a system LSI or the like is included in the category of the present invention. Moreover, even when the MRAM is loaded on a high-speed logic LSI using the Low-k film as an interlayer insulation film, adhesion between the Low-k film and the magneto-resistive element can be sufficiently assured and bad influence to the element characteristics which is caused by the magnetostriction peculiar to the magneto-resistive element can be reduced.

The above-described embodiments can be accomplished individually, but can also be accomplished arbitrarily in combination.

Moreover, each of the above-described embodiments includes the invention of various stages. If a plurality of constituent elements disclosed in each of the embodiments are arbitrarily combined, the invention of various stages can also be extracted.

According to the embodiments of the present invention, as described above, adhesion between the interlayer insulation film (Low-k film) having a small dielectric constant and the magneto-resistive element can be sufficiently assured and bad influence to the element characteristics which is caused by the magnetostriction peculiar to the magneto-resistive element can be reduced. Therefore, the magnetic storage device having an increased reliability on a long-time use can be provided.

In addition, the above-described embodiments can be accomplished individually, but can also be accomplished arbitrarily in combination. Moreover, each of the above-described embodiments includes the invention of various stages. If a plurality of constituent elements disclosed in each of the embodiments are arbitrarily combined, the invention of various stages can also be extracted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic storage device comprising:
    an interlayer insulation film formed on a semiconductor substrate;
    a metal oxide film formed on the interlayer insulation film, having a planar shape;
    a conductive film formed on the metal oxide film, containing a metal element and having a planar shape identical to the planar shape of the metal oxide film; and
    a magneto-resistive element formed on the conductive film.

2. The magnetic storage device according to claim 1, wherein the interlayer insulation film is formed of an oxide containing oxygen, and the interlayer insulation film and the metal oxide film contain oxygen.

3. The magnetic storage device according to claim 1, wherein the metal oxide film and the conductive film contain a metal element.

4. The magnetic storage device according to claim 1, wherein the conductive film comprises:
    a first interconnection layer formed on the metal oxide film, containing a metal element as contained in the metal oxide film; and
    a second interconnection layer formed on the first interconnection layer.

5. The magnetic storage device according to claim 1, wherein the interlayer insulation film has a dielectric constant smaller than a dielectric constant of a silicon oxide film.

6. The magnetic storage device according to claim 5, wherein the dielectric constant of the interlayer insulation film is 3 or smaller.

7. The magnetic storage device according to claim 1, wherein the magneto-resistive element has a MTJ (magnetic tunnel junction) multilayer structure.

8. The magnetic storage device according to claim 7, wherein the MTJ multilayer structure comprises:
    a first ferromagnetic layer formed on the conductive film;
    a nonmagnetic layer formed on the first ferromagnetic layer; and
    a second ferromagnetic layer formed on the nonmagnetic layer.

9. A magnetic storage device comprising:
    an interlayer insulation film formed on a semiconductor substrate;
    a silicon compound film formed on the interlayer insulation film, containing an element;
    a metal compound film formed on the silicon compound film, containing the element;
    a conductive film formed on the metal compound film, containing a metal element; and
    a magneto-resistive element formed on the conductive film.

10. The magnetic storage device according to claim 9, wherein the interlayer insulation film is formed of a silicon compound containing silicon and the interlayer insulation film and the silicon compound film contain silicon.

11. The magnetic storage device according to claim 9, wherein the metal compound film and the conductive film contain a metal element.

12. The magnetic storage device according to claim 9, wherein the conductive film comprises:
    a first interconnection layer formed on the metal compound film, containing a metal element as contained in the metal compound film; and
    a second interconnection layer formed on the first interconnection layer.

13. The magnetic storage device according to claim 9, wherein the interlayer insulation film has a dielectric constant smaller than a dielectric constant of a silicon oxide film.

14. The magnetic storage device according to claim 13, wherein the dielectric constant of the interlayer insulation film is 3 or smaller.

15. The magnetic storage device according to claim 9, wherein the magneto-resistive element has a MTJ (magnetic tunnel junction) multilayer structure.

16. The magnetic storage device according to claim 15, wherein the MTJ multilayer structure comprises:
 a first ferromagnetic layer formed on the conductive film;
 a nonmagnetic layer formed on the first ferromagnetic layer; and
 a second ferromagnetic layer formed on the nonmagnetic layer.

17. The magnetic storage device according to claim 9, wherein the element includes nitrogen.

18. The magnetic storage device according to claim 9, wherein the element includes carbon.

19. The magnetic storage device according to claim 1, wherein the metal oxide film includes a tantalum oxide film and the conductive film contains tantalum.

* * * * *